United States Patent
Goldstein et al.

(10) Patent No.: US 9,219,699 B2
(45) Date of Patent: Dec. 22, 2015

(54) COMPUTER SYSTEM WITH FABRIC MODULES

(75) Inventors: Martin Goldstein, Campbell, CA (US); Dale C. Morris, Steamboat Springs, CO (US); Michael R. Krause, Boulder Creek, CA (US)

(73) Assignee: Hewlett Packad Enterprise Development LP, Houston, TX (US)

( * ) Notice: Subject to any disclaimer, the term of this patent is extended or adjusted under 35 U.S.C. 154(b) by 128 days.

(21) Appl. No.: 13/808,507

(22) PCT Filed: Sep. 15, 2010

(86) PCT No.: PCT/US2010/048970
§ 371 (c)(1),
(2), (4) Date: Jan. 4, 2013

(87) PCT Pub. No.: WO2012/036681
PCT Pub. Date: Mar. 22, 2012

(65) Prior Publication Data
US 2013/0107879 A1    May 2, 2013

(51) Int. Cl.
*G06F 1/16* (2006.01)
*H04L 12/931* (2013.01)
*G06F 1/18* (2006.01)

(52) U.S. Cl.
CPC ............ *H04L 49/40* (2013.01); *G06F 1/181* (2013.01)

(58) Field of Classification Search
CPC ........ G02B 6/28; G06F 15/173; H01R 12/16; H04J 14/00; H04J 14/02; H04L 12/50

USPC .............. 361/788; 370/386–388; 385/24, 46; 398/66–82; 709/239
See application file for complete search history.

(56) References Cited

U.S. PATENT DOCUMENTS

| 5,818,696 | A | 10/1998 | Knoop |
| 6,646,868 | B2 | 11/2003 | Ho et al. |
| 7,515,427 | B2 | 4/2009 | King et al. |
| 2002/0126502 | A1* | 9/2002 | Krol et al. ................ 362/554 |
| 2003/0223199 | A1 | 12/2003 | Smith et al. |
| 2005/0157461 | A1 | 7/2005 | Cauthron |
| 2007/0238326 | A1 | 10/2007 | Fallah-Adl et al. |
| 2008/0112133 | A1 | 5/2008 | Torudbakken et al. |
| 2008/0259555 | A1* | 10/2008 | Bechtolsheim et al. ...... 361/686 |
| 2008/0275975 | A1 | 11/2008 | Pandey et al. |

FOREIGN PATENT DOCUMENTS

WO    WO 2009136896 A1 *  11/2009 ............. H04B 10/00

OTHER PUBLICATIONS

Fried, Ina; Will light replace cables in blade servers? | Beyond Binary—CNET News http://news.cnet.com/8301-13860_3-20002750-56.html; Apr. 19, 2010.

(Continued)

*Primary Examiner* — Jamal Javaid
*Assistant Examiner* — Wali Butt
(74) *Attorney, Agent, or Firm* — Clifton L. Anderson

(57) ABSTRACT

A chassis is configured to hold at least one horizontal row of node modules and a fabric module. The fabric module can be positioned above or below the row so that it can communicatively couple two or more node modules. Each of the node modules and the fabric modules can be inserted into and removed from the chassis longitudinally.

22 Claims, 6 Drawing Sheets

(56) References Cited

OTHER PUBLICATIONS

Suffern et al; Design Considerations for High-Speed Internetworking Among Compute Blades within a Blade Server Chassis; IBM Corporation; Proceedings of the 28th Annual IEEE International Conference on Local Computer Networks (LCN'03) 0742-1303/03 $ 17.00 © 2003 IEEE ; Authorized licensed use limited to: Intellevate (India) Pvt Ltd (3rd Site). Downloaded on Apr. 29, 2010.

Korean Intellectual Property Office, PCT Notification of Transmittal of the International Search Report and the Written Opinion of the International Searching Authority, or the Declaration for PCT/US2010/048970 dated Jun. 27, 2011 (9 pages).

The International Bureau of WIPO, PCT Notification Concerning Transmittal of International Preliminary Report on Patentability for PCT/US2010/048970 dated Mar. 28, 2013 (6 pages).

* cited by examiner

COMPUTER SYSTEM WITH FABRIC MODULES

CROSS-REFERENCE TO RELATED APPLICATION

This application is a national stage application under 35 U.S.C. §371 of PCT/US2010/048970, filed 15 Sep. 2010.

BACKGROUND

A typical blade system includes a chassis for holding several "blades". Each blade can include one or more processor nodes, each of which includes one or more processors and associated memory. The chassis can include a backplane that provides power and connectivity, input/output (I/O) connectivity including network connectivity and inter-blade connectivity. In some blade systems, front connector bars spanning two or more blades provide or supplement inter-blade connectivity. In some blade systems, the inter-blade connectivity provides for cache coherent operation among processor blades associated with different blades. This allows a set of blades to operate as a single more powerful computer rather than as a network of separate computers that happen to be to the same chassis. Blade systems can be upgraded conveniently by swapping previous-generation blades with more capable newer-generation blades. In this sense, blade systems provide a hedge against obsolescence and allow a customer's investment to be amortized over a longer time, decreasing the overall cost of ownership.

DETAILED DESCRIPTION

Figure 1:
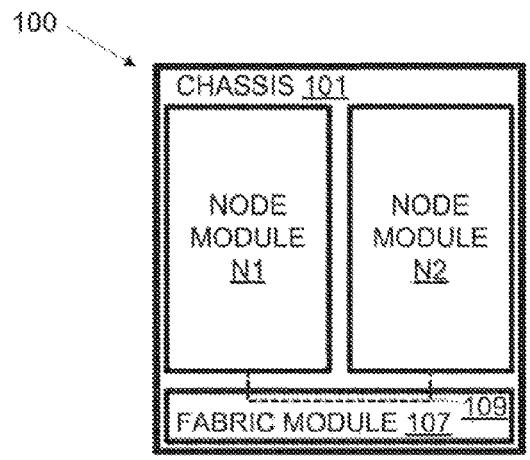
FIG. 1 is a schematic diagram of a modular computer system in accordance with an embodiment.
Figure 2:
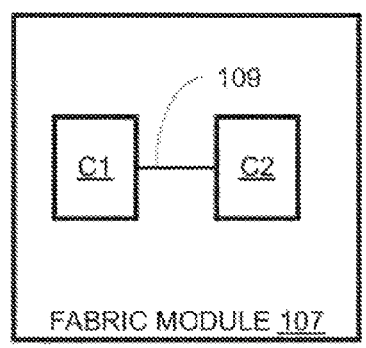
FIG. 2 is a schematic diagram of a fabric module of the computer system of FIG. 1.
Figure 3:
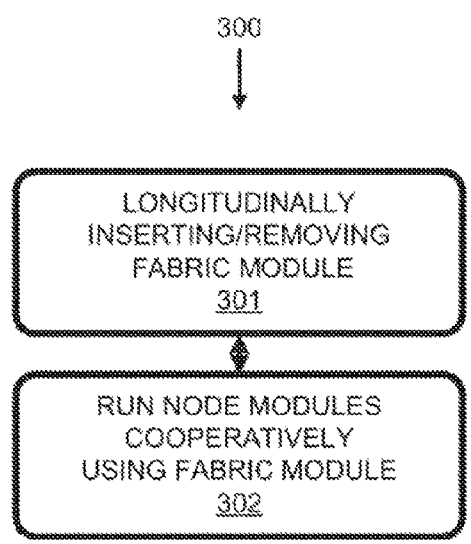
FIG. 3 is a flow chart of a process implementable to the computer system of FIG. 1.

A modular computer system 100, shown in FIG. 1, includes a chassis 101, node modules N1 and N2, and a fabric module 107 that provides routing 109 over which node modules N1 and N2 communicate with each other. To this end, fabric module 107 includes connectors C1 and C2 on its top face 109 for connecting to respective node modules, e.g., node modules N1 and N2, as shown in FIG. 2. Fabric module 107 can be inserted or removed at a process segment 301, in the same longitudinal dimension (into or out of the page given the front view of FIG. 1.) that node modules N1 and N2 can be removed. Node modules N1 and N2 can be run cooperatively, e.g., as a single computer, with fabric module 107 installed at a process segment 302 (winch can occur before a removal or after an insertion of process segment 301).

Herein, "module" refers to a hardware entity that can be inserted into a chassis. The terms "node module" and "fabric module" are defined relative to each other so that a "fabric module" is a module configured to provide communications connectivity between or among node modules. The node modules can include general-purpose or application-specific computer modules (providing processing, storage, and communications, e.g., I/O and networking), modules that emphasize one data handling function, e.g., storage modules, connectivity modules (e.g., network switches dedicated to one or more network layers), application-specific hardware (e.g., sensors and controllers). A "processor module" is a computer module including one or more processor nodes (each of which can include one or more processors and memory). "Blade" herein, refers to a type of node module having a physically "thin" configuration.

Unlike systems in which connectivity is provided by a backplane or a midplane, system 100 permits connectivity to be upgraded without replacing an entire chassis. Fabrics typically can accommodate a small number of computer (e.g., processor) upgrades, but eventually are outstripped by the capabilities of the newer computers. Using replaceable fabric modules allows the chassis to be retained, e.g., for a decade or more rather than for just a few years, through more generations of upgrades. Furthermore, fabric module 107 does not impede front-to-back airflow. Relative to systems that provide inter-blade connectivity using front connector bars, serviceability is improved as fabric module 107 does not have to be removed to replace a connected node module.

Figure 4:
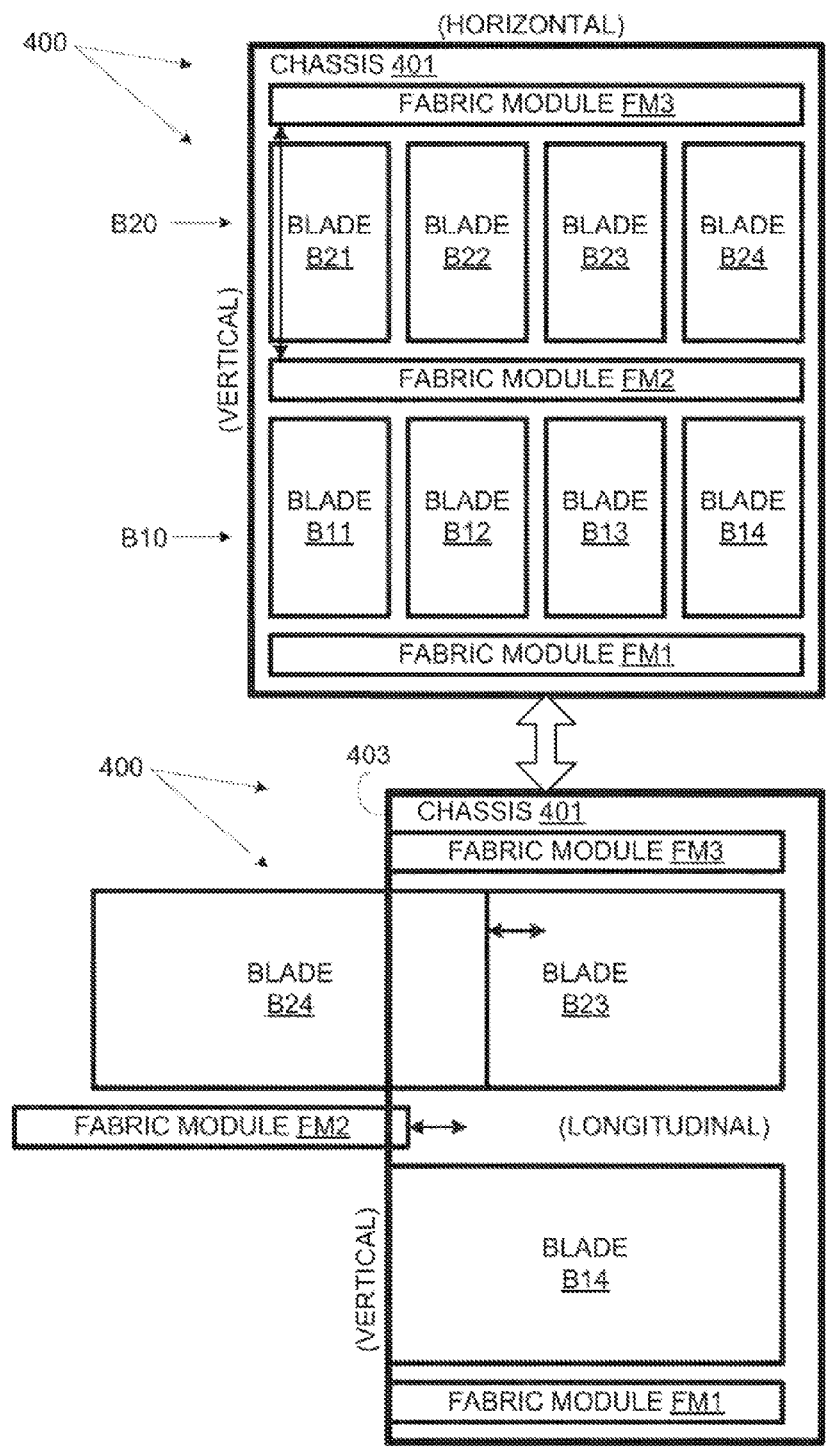
FIG. 4 is a flow diagram for a module swap operation and showing front and side views of a blade computer system in accordance with an embodiment.

A blade system 400 includes a chassis 401, a vertically adjacent pair of rows of blades (node modules) B10 and B20, and fabric modules FM1, FM2, and FM3, as shown in FIG. 4. Row B10 includes blades B11, B12, B13, and B14. Row B20 includes blades B21, B22, B23, and B24. Other embodiments provide for different numbers of rows and different numbers of blades per row. Also, alternative embodiments provide for different numbers of fabric modules for a given number of blade rows. For example, top and bottom fabric modules, such as FM1 and FM3 in FIG. 4, can be omitted.

As shown in the bottom half of FIG. 4 blade B24 and fabric module FM2, blades B11-B14, blades B21-B24, and fabric modules FM1-FM3 are all removable and insertable through the front 403 of chassis 401 using longitudinal motions. Herein, a horizontal-vertical-longitudinal coordinate system is used. "Horizontal" is the dimension in which the blades of a row are spaced; for example, blades B11-B14 are arranged left to right along the horizontal dimension. "Vertical" is the dimension in which a fabric module is spaced from a row of blades connected to it; for example, fabric module FM1, row B10, fabric module FM2, row B20, and fabric module FM3 are arranged bottom to top along the vertical dimension. "Longitudinal" refers to the dimension of insertion for modules. In the illustrated embodiment, these dimensions are substantially orthogonal to each other, in other words, each pair of dimensions defines an acute or right angle more than 45° so that they are more orthogonal than aligned. Herein, terms such as "front", "rear", "top", "bottom", "left", "right" "above", and "below" are to be interpreted in the context of the coordinate system.

Figure 5:
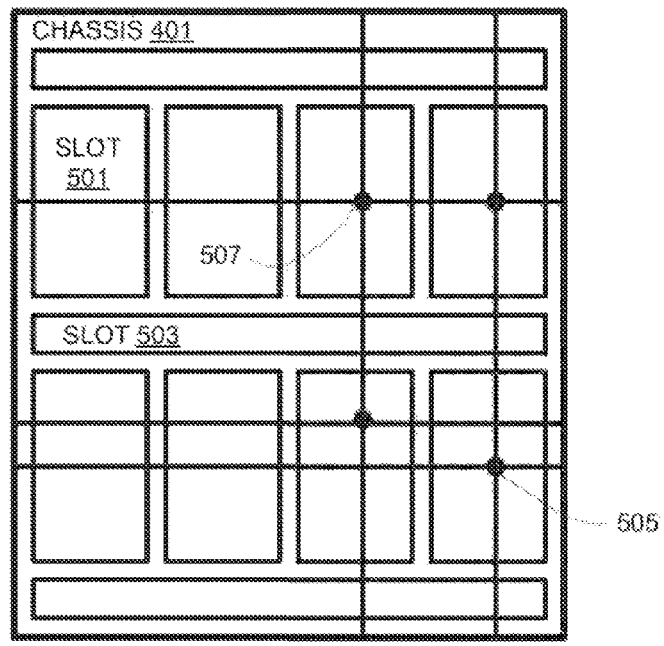
FIG. 5 is a front schematic view of a chassis of the computer system of FIG. 4.

Chassis 401, shown separately in FIG. 5, provides blade (node module) slots 501 and fabric-module slots 503 for receiving, guiding, and securing blades and fabric modules. In some embodiments, other node modules, e.g., network modules, can be installed in the vertical blade slots, with computer-network linkages through fabric modules. In addition, chassis 401 provides power connections 505 for all modules (including blades) and data connections e.g., with peripherals and networks for all blades. Other embodiments include cam and clamping mechanisms for securing modules and for effecting connections between blades and fabric modules. Also, in some embodiments, chasses include integrated cooling, e.g., fans or liquid cooling features. Also, in some embodiments, management features are provided, e.g., virtual ports.

Figure 6:
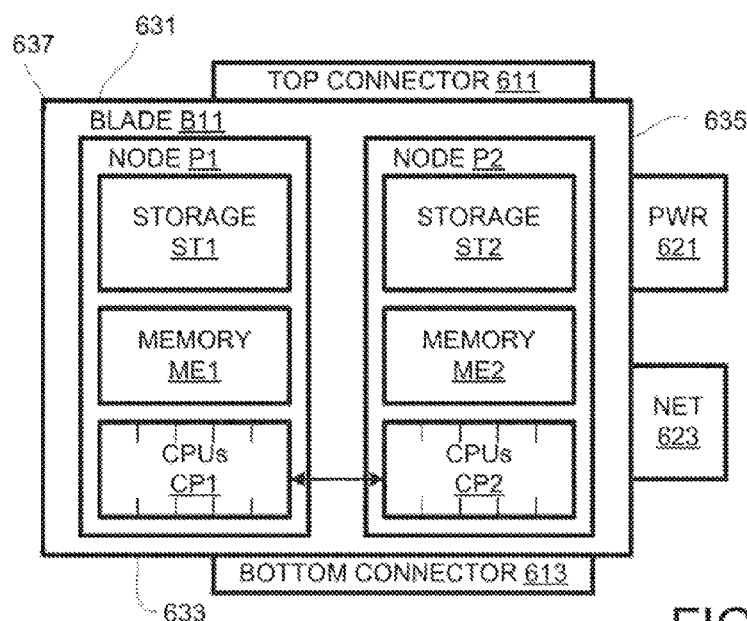
FIG. 6 is a schematic view of a blade of the computer system of FIG. 4.

Blades B12-B14 and B21-B24 are similar to B11, described with reference to FIG. 6. Blade B11 is a processor module including two processor nodes P1 and P2. In alternative embodiments, blades can include one processor node or more than two processor nodes; different blades can have different numbers of processors and amounts of memory per node. Processor node N1 includes four processors CP1, memory (RAM) ME1, and storage (ST1). Processor node N2 includes four processors CP2, memory (RAM) ME2, and storage (ST2). Processor nodes P1 and P2 are coupled so that they can operate coherently—i.e., as though memories ME1 and ME2 constituted a unified memory that can be addressed directly by any processor of nodes N1 and N2.

Blade B11 includes a top connector 611 and a bottom connector 613 for connecting to vertically adjacent fabric modules, e.g., modules FM2 and FM1, respectively in FIG. 4. Each blade can be configured so that zero, one, or both of its top and bottom connectors are active. Blade B11 also includes on its rear face 635 power and network connectors 621 and 623, respectively, for receiving power and establishing specialized connectivity, e.g., such as for management. Connectors 621 and 623 are on the top 631 and bottom 633 of blade B11 respectively, more toward the rear face 635 of blade B11 than its front face 637.

Various embodiments employ different techniques to achieve connectivity with communication signals: (a) card edge connector, where the card edge of the blade module slides between two adjacent connectors, (b) cam down or up actuation, where the blade slides in and is pressed down against a traditional connector on the shelf via a cam action, (c) flex-cable connector, where the blade slides in and the connector's flex cable extension is pressed down or up against a shelf using a cam action, and (d) optically interconnected systems where the shelf contains optical "traces" (e.g., waveguides) and the connection may be made with a slide-by, self-aligning set of optical connectors.

Figure 7:
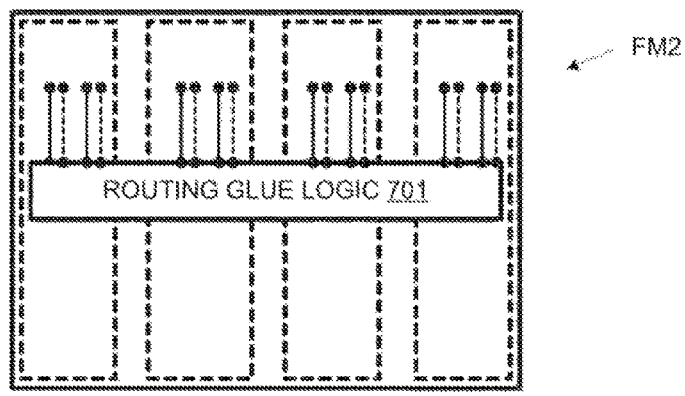
FIG. 7 is a schematic view of a fabric module of the computer system of FIG. 4.

Fabric module FM2 is represented in FIG. 7. Routing glue logic 701 provides a switched star topology for full 8×8 routing. (Connectors shown using dashed lines are on she bottom of fabric module FM2). A particular routing can be selected via a front panel of fabric module FM2 or by a management station connected to blade system 400. In addition to routing, routing glue logic 701 provides other glue functions such as signal buffering and snoop filtering.

Figure 8:
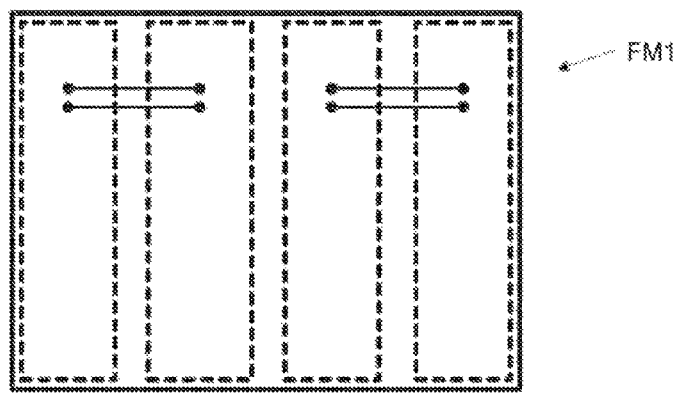
FIG. 8 is a schematic view of a fabric module of the computer system of FIG. 4.
Figure 9:
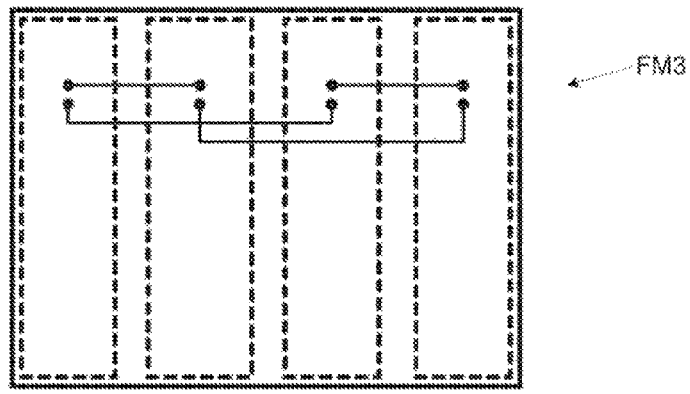
FIG. 9 is a schematic view of a fabric module of the computer system of FIG. 4.

Fabric module FM1 is represented in FIG. 8. It is adapted to couple the two rightmost blades and the two leftmost blades in a row. Fabric module FM3 is depicted in FIG. 9. It is adapted to connect four blades in a row. In an alternative embodiment, a fabric module has the pattern and connectors shown in FIG. 8 on its top face and the pattern and connectors of FIG. 9 on its bottom face; other alternative embodiments can have different patterns on their top and bottom faces. In some such embodiments, a connection configuration can be changed by inverting a fabric module with different patterns (and connectors) on its top and bottom faces even though the fabric module itself is not dynamically reconfigurable.

Figure 10:
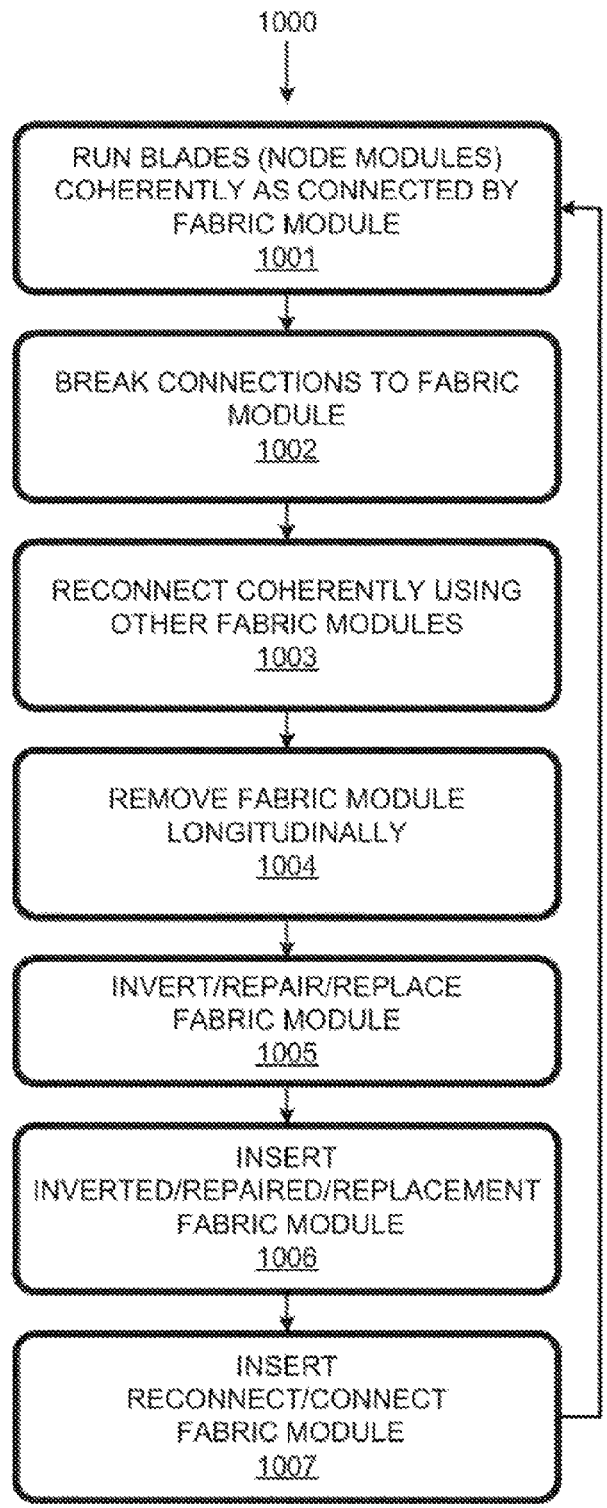
FIG. 10 is a flow chart of a process implementable in the system of FIG. 4.

In practice, computer system 400, FIG. 4, could be operated with the blades communicatively connected to fabric module FM2 and not communicatively coupled to fabric modules FM1 and FM3, e.g., at a process segment 1001 of a process 1000 flow charted in FIG. 10. To prepare for repairing or replacing fabric module FM2, process segment 1002 provides for breaking the connection between fabric module FM2 and any blades connected to it. If it is desired to run some of these blades coherently, they can be reconnected at process segment 1003 using other fabric modules, e.g., fabric modules FM1 and FM3. This may not result in the exact configuration provided by fabric module FM2, but may still improve upon running blades individually.

Fabric module FM2 can be removed longitudinally at process segment 1004. The removed fabric module can be repaired, inverted, or replaced at process segment 1005. Once repair is complete, the module inverted, or a replacement is found, the resulting fabric module can be inserted longitudinally at process segment 1006. To effect coherent processing via connections of the newly inserted fabric modules, communicative connections to the other fabric modules can be broken and communicative connections to the newly inserted module established at process segment 1007.

Figure 11:
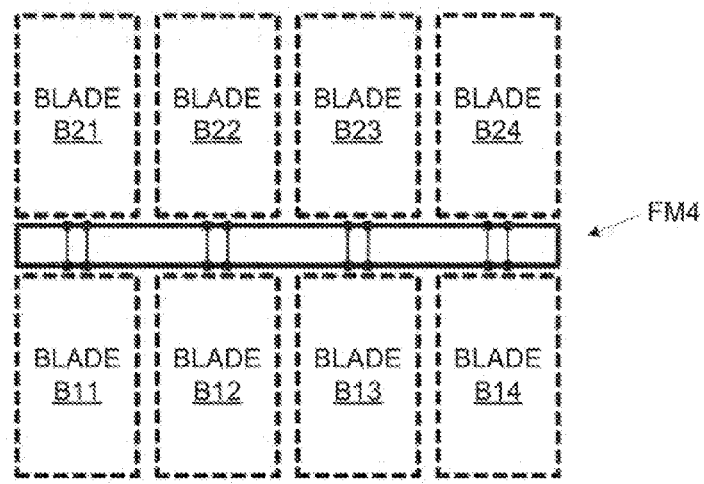
FIG. 11 is a schematic diagram for a fabric module installable in the system of FIG. 4.
Figure 12:
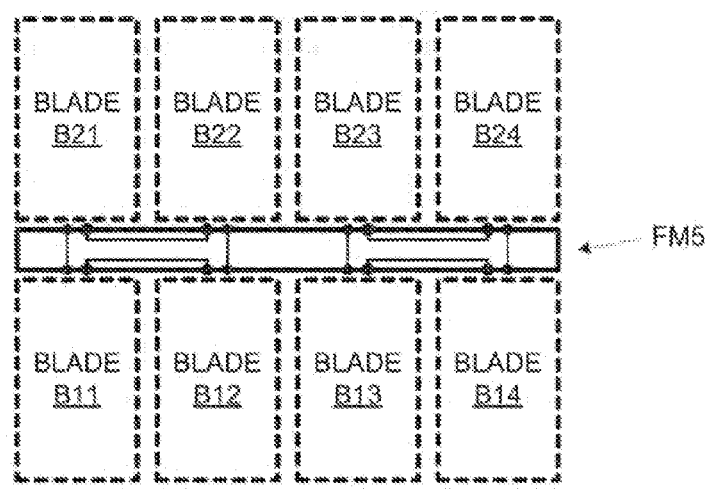
FIG. 12 is a schematic diagram for a fabric module installable in the system of FIG. 4.

A couple of other fabric modules FM4 and FM5 ate shown in FIGS. 11 and 12, respectively. Fabric module FM4 provides four-point connections between vertical pairs of two-node blades. Thus, for example, the two processor nodes of blade B11 and the two processor nodes of blade B21 are grouped to form a four processor-nude set that runs coherently. Fabric module FM5 provides eight-point connections for left and right blocks of four blades.

Blade system 400 provides for fabric modules of many other glued and glueless configurations. Also, communicative connections can be electrical, optical or both. Some fabric modules may provide for different connection configurations by inverting the fabric module vertically, i.e., installing it after a 180° rotation about a longitudinal axis. Some fabric modules may have fixed configurations; others may be reconfigurable while installed. Connections can be made using more than one fabric module by using both top and bottom blade connectors. Such connections can be made through the processor nodes of a blade. Also, a specially designed blade can allow a direct connection between upper and lower fabric modules. For example, blade B21 of FIG. 4 provides for a direct connection between fabric modules FM2 and FM3.

System 400 thus provides for a customer installable fabric module "shelf"; in general, this can mean that the cost for high speed blade-to-blade connectivity is only paid when it is used. Connected blades can be independently serviced or upgraded. One chassis can be enabled for a variety of configurations depending on the nature of the fabric modules installed. Also, to its horizontal orientation, a fabric module does not impede front-to-back airflow, unlike a traditional front-plane or mid-plane. Furthermore, the interconnect shell itself can be independently serviced or upgraded.

In other blade systems, blades may be swappable through the front face of a chassis while fabric modules are swappable through the rear. This configuration can allow connections between fabric and blades that are effected by abutting instead of sliding by each other. Some blade systems use one-sided patterns; to connect to blade both above and below, a pair of fabric modules can be inserted back-to-back. The back-to-back connection can provide inter-layer connections between the fabric modules and thus between rows of blades. Some blade systems use both horizontal and vertical fabric modules (and corresponding slots), defining a rectangular array of "cubbie holes", each of which can hold multiple compute and network blades.

In some embodiments, a chassis configured to hold processor modules and one or more fabric modules is unpopulated, i.e., does not presently hold any processor modules or fabric modules. In other embodiments, such a chassis is partially or completely populated by other types of modules, e.g., modules having primary purposes, e.g., data input or output or both, other than data processing or inter-module routing. "Coherently" herein applies to a multi-processor system for which multiple processors treat a common or collective memory as a unified whole having a single consistent state. "Cooperatively" means working interactively (either coherently or non-coherently) to accomplish a goal.

Herein, a "system" is a set of interacting elements, wherein the elements can be, by way of example and not of limitation, mechanical components, electrical elements, atoms, the physically encoded forms of instructions encoded in storage media, and process segments. In this specification, related art is discussed for expository purposes. Related art labeled "prior art", if any, is admitted prior art. Related art not labeled "prior art" is not admitted prior art. The illustrated and other described embodiments, as well as modifications thereto and variations thereupon are within the scope of the following claims.

What is claimed is:

1. A system comprising:
  a chassis configured to hold a plurality of node modules and fabric modules, said plurality of node modules including node modules arranged in a row, said chassis being configured to hold a first fabric module of said fabric modules in a position above or below said row so that said first fabric module is physically connected to at least two of said node modules in said row so as to provide communications connectivity between said at least two of said node modules in said row, said chassis being configured to accept insertion in a longitudinal direction of said plurality of node modules and said fabric modules, and said first fabric module being removable in said longitudinal direction from said chassis without first removing said node modules in said row that remain in said chassis,
  wherein a first node module of said node modules in said row includes a first connector on a first surface of said first node module and a second connector on a second, opposite surface of said first node module, said first connector to connect with a mating connector of said first fabric module, and said second connector to connect with a mating connector of a second fabric module of said fabric modules.

2. A system as recited in claim 1 wherein said chassis is configured to provide power to said plurality of node modules when held by said chassis.

3. A system as recited in claim 1 wherein said node modules include processor modules, and said first fabric module provides for coherent processing between at least two of said processor modules.

4. A system as recited in claim 1 wherein said chassis is configured to hold vertically adjacent rows of node modules, at least one of said fabric modules being disposed between said rows of node modules.

5. A system as recited in claim 3 wherein said first fabric module is configured to provide for different groupings of coherent processor modules in response to commands without being removed from said chassis.

6. A system as recited in claim 4 wherein said node modules include processor modules, and wherein at least one of said fabric modules is configured to provide for glueless coherent processing between processor modules of said rows.

7. A system as recited in claim 3 wherein said first fabric module can provide for different groupings of coherent processor modules according to its physical inversion state.

8. A method comprising:
  providing, in a chassis, fabric modules and a row of node modules, a first fabric module of said fabric modules at a position above or below said row of node modules, and said first fabric module physically connected to at least two of said node modules, and said node modules and fabric modules being insertable into or removable from said chassis in a longitudinal direction;
  providing a first node module of said node modules in said row with a first connector on a first surface of said first node module and a second connector on a second, opposite surface of said first node module, said first connector to connect with a mating connector of said first fabric module, and said second connector to connect with a mating connector of a second fabric module of said fabric modules; and
  removing said first fabric module from said chassis in said longitudinal direction, without first removing said node modules in said row from said chassis.

9. A method as recited in claim 8 wherein said position is between two vertically adjacent rows of node modules, the method further comprising running node modules from different ones of said rows cooperatively using communicative connections through said first fabric module.

10. A method as recited in claim 8 further comprising, while said first fabric module is in said position, reconfiguring said first fabric module so as to change a grouping of node modules.

11. A method as recited in claim 8 further comprising communicatively coupling said first fabric module and said second fabric module through one of said node modules disposed between said first and second fabric modules.

12. A method as recited in claim 8 further comprising, after removing said first fabric module, reinserting, into said chassis, said first fabric module inverted relative to its previous orientation.

13. A method as recited in claim 8
  wherein at least some of said node modules are processor modules, and
  wherein said fabric module provides for glueless coherent running of a group of processor modules.

14. A system as recited in claim 1 wherein said first node module further comprises a power connector on a rear surface of said first node module, said power connector to receive power for said first node module.

15. A system as recited in claim 1 further comprising said second fabric module, and wherein after said first fabric module is removed from said chassis and disconnected from said first node module in said row, said first node module is communicatively connected to said second fabric module to establish communicative communication with said second fabric module.

16. A system as recited in claim 15, wherein after reinserting said removed first fabric module into said chassis, said first node module in said row is communicatively disconnected from said second fabric module and communicatively connected to said first fabric module.

17. A method as recited in claim 8 further comprising, after removing said first fabric module from said chassis, reinserting said first fabric module into said chassis, wherein reinsertion of said first fabric module into said chassis causes connection of said connector on said first surface of said first node module with said mating connector of said first fabric module.

18. A method as recited in claim 8 further comprising:
prior to removing of said first fabric module from said chassis, said first fabric module is communicatively connected to said first fabric module but not communicatively connected to said second fabric module; and
after removing said first fabric module from said chassis, communicatively connecting said first node module to said second fabric module.

19. A system as recited in claim 1, wherein said first surface is a top surface of said first node module, and said second surface is a bottom surface of said first node module.

20. A system as recited in claim 1, wherein said first node module comprises a blade that includes a plurality of nodes, each node of the plurality of nodes including a central processing unit (CPU) and a storage.

21. A method as recited in claim 8, wherein said first surface is a top surface of said first node module, and said second surface is a bottom surface of said first node module.

22. A method as recited in claim 8, wherein said first node module comprises a blade that includes a plurality of nodes, each node of the plurality of nodes including a central processing unit (CPU) and a storage.

\* \* \* \* \*